(12) United States Patent
MacDougall

(10) Patent No.: US 7,287,210 B2
(45) Date of Patent: Oct. 23, 2007

(54) CONVOLUTIONAL ENCODER AND METHOD OF OPERATION

(75) Inventor: Scott MacDougall, Kilmarnock (GB)

(73) Assignee: Freescale Semiconductor, Inc., Austin, TX (US)

( * ) Notice: Subject to any disclaimer, the term of this patent is extended or adjusted under 35 U.S.C. 154(b) by 396 days.

(21) Appl. No.: 10/255,278

(22) Filed: Sep. 26, 2002

(65) Prior Publication Data
US 2003/0074627 A1 Apr. 17, 2003

(30) Foreign Application Priority Data
Sep. 28, 2001 (GB) ................................ 0123327.9

(51) Int. Cl.
*H03M 13/23* (2006.01)
*H03M 13/27* (2006.01)
(52) U.S. Cl. ........................................ 714/786; 714/746
(58) Field of Classification Search .............. 714/786, 714/746, 792, 795
See application file for complete search history.

(56) References Cited

U.S. PATENT DOCUMENTS

| | | | |
|---|---|---|---|
| 4,989,171 A * | 1/1991 | Hollmann ................... 708/492 |
| 5,157,215 A * | 10/1992 | Nakae et al. ................. 84/624 |
| 5,890,105 A | 3/1999 | Ishihara et al. |
| 5,970,097 A * | 10/1999 | Ishikawa et al. ............ 375/262 |
| 6,182,265 B1 | 1/2001 | Lim et al. |
| 6,192,384 B1 * | 2/2001 | Dally et al. .................. 708/200 |
| 6,516,439 B2 * | 2/2003 | Kodama et al. ............ 714/758 |

OTHER PUBLICATIONS

Tomlinson et al., "Small Improvements in Half-Rate Convolutional Codes with Popular Constraint Lengths for Applications in Satellite Communications," IEEE Proceedings, vol. 144, Issue 3, Jun. 1997, pp. 199-204.

* cited by examiner

*Primary Examiner*—Cynthia Britt
*Assistant Examiner*—Dipakkumar Gandhi

(57) ABSTRACT

Convolutionally encoding a data stream includes inputting a first block of two or more bits in parallel into a shift register. A number of intermediate calculations are performed in parallel using a number of respective delayed shift register outputs; and said number of intermediate calculations are output to form a convolutionally encoded sequence.

In one example, a register (of individual bits stored in words), is set up. The register is longer than the constraint length means that a relatively large number of input bits can be read from memory only once, thus avoiding many independent moves of operands to and from memory. Since the register is longer than the constraint length, the register need only be shifted once for every 'a+1' input bits, rather than once for each bit.

16 Claims, 7 Drawing Sheets

OUTPUT y(k+2): (D0+D6)+D1+D4
OUTPUT y(k+1): (D0+D6)+D1+(D2+D3)
OUTPUT y(k):   (D0+D6)+(D2+D3)+D5

```
/*INITIALISE REGISTER ELEMENTS*/
  REG0 = INPUTDATA[3];      4TH INPUT BIT
  REG1 = INPUTDATA[2];      3RD INPUT BIT
  REG2 = INPUTDATA[1];      2ND INPUT BIT
  REG3 = INPUTDATA[0];      1ST INPUT BIT
  REG4 = REG5 = REG6 = REG7 = REG8 = REG9 = 0; INITIALISE REMAINING BITS

/* CALCULATE 4 INPUT BITS / 12 OUTPUT BITS PER LOOP  */
     /* AND SHIFT REGISTER BY 4 BITS PER LOOP  */
     FOR (k=0; k<number_input_bits; k+=4)
     {
            /********************** STAGE 1 **********************/

/*1ST INPUT BIT*/
            INPUT1_TEMP1 = REG3 ^ REG9;              /*D0+D6*/
            INPUT1_TEMP2 = REG5 ^ REG6;              /*D2+D3*/

/*2ND INPUT BIT*/
            INPUT2_TEMP1 = REG2 ^ REG8;              /*D0+D6*/
            INPUT2_TEMP2 = REG4 ^ REG5;              /*D2+D3*/

/*3RD INPUT BIT*/
            INPUT3_TEMP1 = REG1 ^ REG7;              /*D0+D6*/
            INPUT3_TEMP2 = REG3 ^ REG4;              /*D2+D3*/

/*4TH INPUT BIT*/
            INPUT4_TEMP1 = REG0 ^ REG6;              /*D0+D6*/
            INPUT4_TEMP2 = REG2 ^ REG3;              /*D2+D3*/

/********************** STAGE 2 **********************/

/*1ST INPUT BIT*/
            INPUT1_TEMP3 = INPUT1_TEMP1 ^ REG4;          /*D0+D1+D6   */
            INPUT1_TEMP1 = INPUT1_TEMP1 ^ INPUT1_TEMP2;  /*D0+D2+D3+D6*/

/*2ND INPUT BIT*/
            INPUT2_TEMP3 = INPUT2_TEMP1 ^ REG3;          /*D0+D1+D6   */
            INPUT2_TEMP1 = INPUT2_TEMP1 ^ INPUT2_TEMP2;  /*D0+D2+D3+D6*/

/*3RD INPUT BIT*/
            INPUT3_TEMP3 = INPUT3_TEMP1 ^ REG2;          /*D0+D1+D6   */
            INPUT3_TEMP1 = INPUT3_TEMP1 ^ INPUT3_TEMP2;  /*D0+D2+D3+D6*/

/*4TH INPUT BIT*/
            INPUT4_TEMP3 = INPUT4_TEMP1 ^ REG1;          /*D0+D1+D6   */
            INPUT4_TEMP1 = INPUT4_TEMP1 ^ INPUT4_TEMP2;  /*D0+D2+D3+D6*/
```

*FIG. 8A*

```
/********************** STAGE 3 **********************/
/*1ST INPUT BIT*/
OUTPUTDATA++=INPUT1_TEMP1^REG8;          /*D0+D2+D3+D5+D6*/
OUTPUTDATA++=INPUT1_TEMP1^REG4;          /*D0+D1+D2+D3+D6*/
OUTPUTDATA++=INPUT1_TEMP3^REG7;          /*D0+D1+D4+D6   */

/*2ND INPUT BIT*/
OUTPUTDATA++=INPUT2_TEMP1^REG7;          /*D0+D2+D3+D5+D6*/
OUTPUTDATA++=INPUT2_TEMP1^REG3;          /*D0+D1+D2+D3+D6*/
OUTPUTDATA++=INPUT2_TEMP3^REG6;          /*D0+D1+D4+D6   */

/*3RD INPUT BIT*/
OUTPUTDATA++=INPUT3_TEMP1^REG6;          /*D0+D2+D3+D5+D6*/
OUTPUTDATA++=INPUT3_TEMP1^REG2;          /*D0+D1+D2+D3+D6*/
OUTPUTDATA++=INPUT3_TEMP3^REG5;          /*D0+D1+D4+D6   */

/*4TH INPUT BIT*/
OUTPUTDATA++=INPUT4_TEMP1^REG5;          /*D0+D2+D3+D5+D6*/
OUTPUTDATA++=INPUT4_TEMP1^REG1;          /*D0+D1+D2+D3+D6*/
OUTPUTDATA++=INPUT4_TEMP3^REG4;          /*D0+D1+D4+D6   */

/************* SHIFT REGISTER BY 4 BITS *************/
REG9 = REG5;
REG8 = REG4;
REG7 = REG3;
REG6 = REG2;
REG5 = REG1;
REG4 = REG0;
REG3 = INPUTDATA[k+4];
REG2 = INPUTDATA[k+5];
REG1 = INPUTDATA[k+6];
REG0 = INPUTDATA[k+7];
```

*FIG. 8B*

CONVOLUTIONAL ENCODER AND METHOD OF OPERATION

FIELD OF THE INVENTION

This invention relates to convolutional coding. The invention is applicable to, but not limited to, convolutional coding performed by a digital signal processor in a communication unit in a wireless communication system.

BACKGROUND OF THE INVENTION

The fundamental concepts and mathematical theory of information transmission were developed and described by C. E. Shannon many years ago. Shannon perceived that it was possible to transmit digital information over a noisy channel with an arbitrarily small error probability by employing appropriate channel encoding and decoding.

The goal of approaching such error-free transmission can be achieved when the information transmission rate is less than the channel capacity, in bits per second. Since Shannon's work, a great deal of effort has been exerted by many researchers to find better and more efficient coding and decoding methods for error control. As a result, many different types of codes, primarily block codes and convolutional codes, have been developed and used in modern digital communication systems.

Block codes are implemented by combination logic circuits, examples of which include: Reed-Muller (RM) codes, cyclic codes, array codes, single-error-correcting (SEC) Hamming codes, and Reed-Solomon (RS) codes.

Convolutional codes are implemented by sequential logic circuit and are also called tree codes or trellis codes. In general, block and convolutional codes can be binary or non-binary, linear or non-linear, and systematic or nonsystematic. At the receiving end, the channel decoder uses any redundancy in the channel code sequence to correct errors, if there are any, in the received channel sequence. The decoder then produces an estimate of the source information sequence.

Modern digital communication systems have evolved to the extent that they now often require error-free recovery of transmitted data. Errors, caused by signal distortion, are introduced into wireless transmitted signals primarily due to multi-path and fading effects. Furthermore, cellular radio technology attempts to maximise use of the limited channel bandwidth by reusing the available frequencies in different cells. As a result, cellular radio systems also suffer from significant co-channel and adjacent channel interference in addition to the effects of multipath and fading.

The errors/distortion introduced into wireless transmitted signals result in received bits being wrongly decoded. Hence, the issue of data integrity, where error protection is required or desired, is therefore becoming increasingly important. To offer some protection against such distortion effect, channel coding is used.

A channel-coding scheme may typically include such techniques as cyclic redundancy checking, convolutional encoding and interleaving. Convolutional encoding introduces redundancy into the data to be transmitted by effectively spreading out the information contained in each bit. The use of convolutional encoding, together with Viterbi decoding, enables some of the bits received in error to be corrected. Hence, efficient and effective error-correcting codes are therefore highly desirable, particularly in a wireless communication system.

A convolutional code depends not only on the last information frame, but also on n preceding information frames. As a consequence, convolutional encoding is known to require a relatively large number of simple computations. A typical convolutional encoding scheme is defined in the GSM EDGE standard ["GSM 05.03 v8.3.0 (2000-02): "Digital Cellular Telecommunications System (Phase 2+); Channel Coding"].

The scheme is defined by:
(i) Its rate (r), which is 1/3 (meaning 3 results are output for each input),
(ii) Its constraint length (K), which is 7, and
(iii) Its polynomials, which are:

$$y(3k)=D0 \oplus D2 \oplus D3 \oplus D5 \oplus D6 \qquad [1]$$

$$y(3k+1)=D0 \oplus D1 \oplus D2 \oplus D3 \oplus D6 \qquad [2]$$

$$y(3k+2)=D0 \oplus D1 \oplus D4 \oplus D6 \qquad [3]$$

where:
K is the constraint length of the convolutional encoding scheme,
k—indexes 'k' input bits,
y(k) is output data,
Dn=x(k−n), x(k) is input data, and
$\oplus$ represents modulo-two addition, or the exclusive-or operation.

The GSM/Edge coding scheme can be represented as a shift register configuration 100, as shown in FIG. 1. A sequence of bits x(k) is input to a series of shift registers 115 to 145 for successively transferring the bit sequence. The output sequence can then be obtained by combining appropriately shifted bits output from the shift registers with the eleven binary adders 160 as shown, to provide the three output polynomials 170, 175, 180 as illustrated in equations [1] to [3].

The input-output function of this shift-register sequence is linear (as only linear elements are involved) and time-invariant: a delay of one shift at the input causes a delay of three shifts at the output. Thus, we get a convolutional (3,1)-code.

A key factor in the implementation of convolutional coding schemes is how to implement the theory in an efficient and effective processing manner. The performance capabilities and use of digital signal processors (DSPs) is continually increasing, as applications become more complex. Wireless communications is one such application.

DSPs now include the use of multi-core devices, co-processors and devices with single or multiple arithmetic login units (ALUs). The modern architectures of these devices allow independent calculations to be performed in parallel, thus prompting new approaches when implementing traditional DSP-related functions.

In addition, it is known that assembly language programming is a time-consuming process. For equipment manufacturers, assembly language programming potentially leads to increased time to market as well as difficult maintenance. These problems are compounded in modern multi-ALU devices with their complex architectures.

Fortunately, recent increases in processor performance and advancing compiler technology now make it feasible to implement most DSP functionality in a programming language such as 'C'. Despite ever-improving compiler technology it is still necessary for the programmer to use knowledge of the application and the device to make maximum use of the parallel processing capability available.

A need therefore exists for an efficient convolutional encoder configuration wherein the abovementioned disadvantages may be alleviated.

SUMMARY

In accordance with a first aspect of the present invention there is provided a method of convolutionally encoding a data stream characterised by the following steps:
  inputting a first block of two or more bits in parallel into a shift register;
  performing a number of intermediate calculations in parallel using a number of respective delayed shift register outputs; and
  outputting said number of intermediate calculations to form a convolutionally encoded sequence.

In accordance with a second aspect of the present invention there is provided a convolutional encoder adapted to perform the method steps of the first aspect of the invention.

In accordance with a third aspect of the present invention, there is provided a communication unit adapted to perform the convolutional encoding method steps of the first aspect of the invention.

In accordance with a fourth aspect of the present invention, there is provided a communication system, adapted to facilitate the convolutional encoding method steps of the first aspect of the invention.

In accordance with a fifth aspect of the present invention, there is provided a convolutional encoder for convolutionally encoding a data stream the convolutional encoder comprising:
  one or more input ports;
  a shift register operably coupled to said one or more input ports for receiving said data stream;
  calculation means, operably coupled to said shift register to perform logical calculations on delayed outputs from said shift register; and
  one or more output ports, operably coupled to said calculation means, to output a convolutionally encoded data stream;

the convolutional encoder characterised by:
  said shift register receiving a first block of two or more bits of said data stream in parallel; and
  said calculation means performing a number of intermediate calculations in parallel using a number of respective delayed shift register outputs.

In accordance with a sixth aspect of the present invention, there is provided a communication unit comprising the convolutional encoder of the fifth aspect of the invention.

In accordance with a seventh aspect of the present invention, there is provided a communication system comprising the communication unit of the sixth aspect of the invention.

Further aspects of the invention are provided in the dependent claims.

In summary, the preferred embodiment of the present invention proposes a convolutional encoder and method of convolutionally encoding a data stream by inputting a block of two or more bits of an input data stream in parallel into a shift register. A number of intermediate calculations can be made in parallel, using a number of respective delayed shift register outputs. The results of these intermediate calculations can then be re-used efficiently to generate a convolutionally encoded output sequence.

BRIEF DESCRIPTION OF THE DRAWINGS

Exemplary embodiments of the present invention will now be described, with reference to the accompanying drawings, in which:

FIG. 8a and FIG. 8b show an example of 'C'—code that can form a basis for implementing the aforementioned preferred embodiment of the present invention.

DESCRIPTION OF PREFERRED EMBODIMENTS

Figure 2:
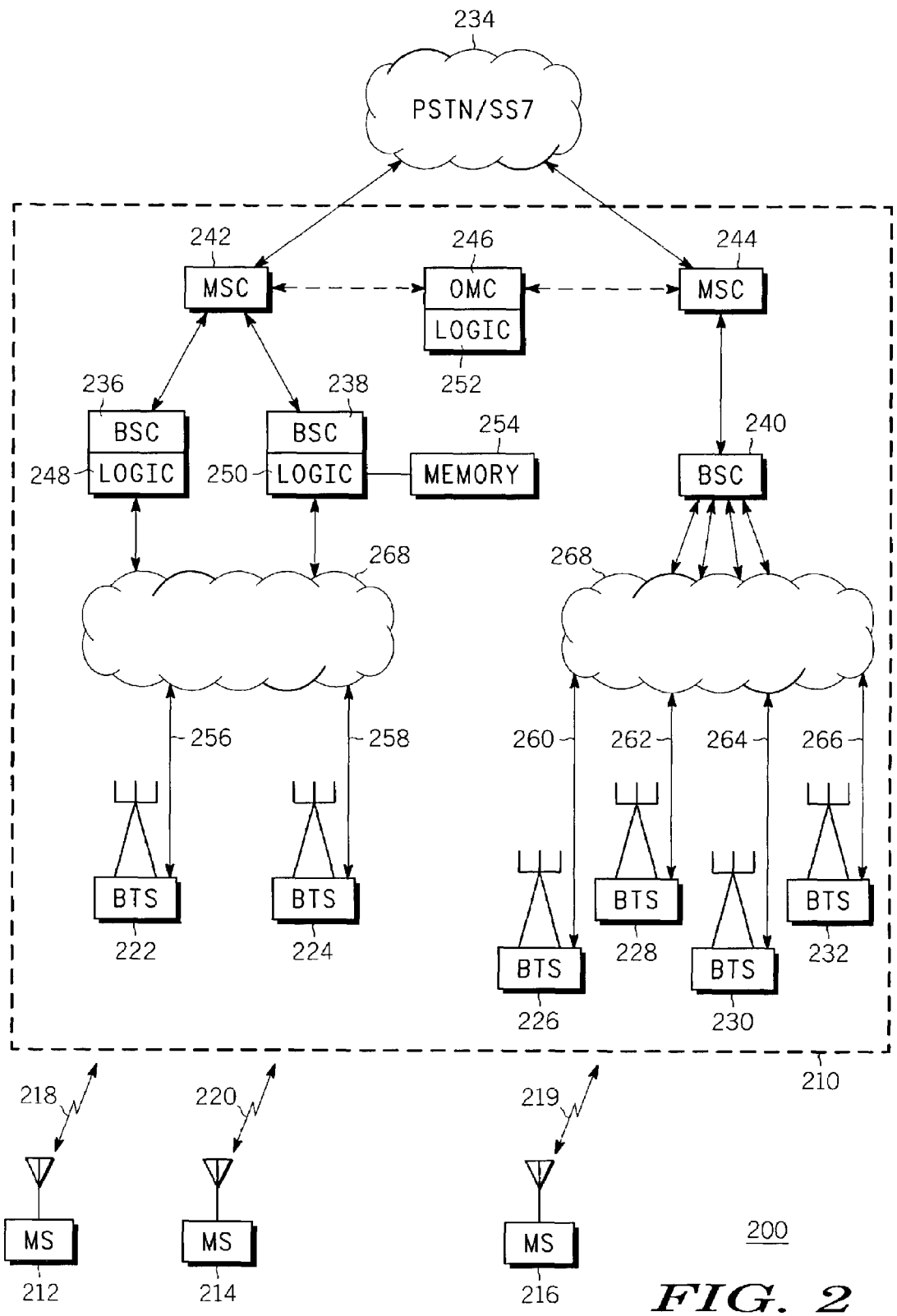
FIG. 2 shows a block diagram of a cellular radio communications system adapted to support the various inventive concepts of a preferred embodiment of the present invention.

The preferred embodiment of the present invention relates to the implementation of convolutional encoding in a wireless communication system. The preferred embodiment will be described with reference to a cellular telephone communication system, as shown in FIG. 2. However, it is within the contemplation of the invention that any communication system requiring or benefiting from convolutional encoding technology would benefit from the inventive concepts described herein.

Referring first to FIG. 2, a cellular telephone communication system 200 is shown, in outline, supporting a Global System for Mobile communication (GSM) air-interface, in accordance with a preferred embodiment of the invention. The European Telecommunications Standards Institute (ETSI) has defined the GSM air-interface.

Generally, the air-interface protocol is administered from base transceiver sites, within the network architecture 210, that are geographically spaced apart—one base site supporting a cell (or, for example, sectors of a cell), as shown in FIG. 2. Similarly, co-located base transceiver sites supporting, say, both pico- and micro-cellular communications may also benefit from the inventive concepts described herein.

A plurality of subscriber units 212-216 communicate over the selected air-interface 218-220 with a plurality of base transceiver stations (BTS) 222-232. A limited number of MSs 212-216 and BTSs 222-232 are shown for clarity purposes only. The BTSs 222-232 may be connected to a conventional public-switched telephone network (PSTN) 234 through base station controllers (BSCs) 236-240 and mobile switching centres (MSCs) 242-244.

Each BTS 222-232 is principally designed to serve its primary cell, with each BTS 222-232 containing one or more transceiver units and communicating 256-266 with the rest of the cellular system infrastructure Each Base Station Controller (BSC) 236-240 may control one or more BTSs 222-232, with BSCs 236-240 generally interconnected through MSCs 242-244. Processes within the MSCs are provided to account for the situation where a MS (212-216) passes between two BTS serving areas, for example MS 212 moving from an area covered by BTS 222 to an area covered by BTS 224, where the two BTSs are controlled by different BSCs (BSC 236 and BSC 238 in this example).

Similar processes are supported in MSCs to account for the situation where an MS moves between serving BTSs where these BTSs are connected to different MSCs. These mechanisms therefore allow the cellular telephone communication system to support handover of MSs 212-216 between cells for most, if not all, cases encountered.

Each MSC 242-244 provides a gateway to the PSTN 234, with MSCs 242-244 interconnected through an operations and management centre (OMC) 246 that administers general control of the cellular telephone communication system 200, as will be understood by those skilled in the art.

The various system elements, such as BSCs 236-238 and OMC 246, will include control logic 248, 250, 252, with the various system elements usually having an associated memory function 254 (shown only in relation to BSC 238 for the sake of clarity). If, in other communication systems, such elements need to extract data from a received bit stream, such that the element includes coding circuitry, the elements will be adapted to implement the inventive concepts of the convolutional coder described later with respect to FIGS. 4 to 7.

However, in accordance with the preferred GSM/Edge embodiment of the present invention, it is envisaged that one or more MS 212, 214, 216 and/or one or more BTS 222-232 have been adapted to implement the inventive concepts of the convolutional coder described in detail with respect to FIGS. 4 to 7.

Referring now to FIG. 2, a block diagram of a subscriber unit/mobile station (MS) 212 adapted to support the inventive concepts of the preferred embodiments of the present invention is shown.

It is noteworthy that a substantially similar arrangement is used in the corresponding BTS 222. As such, the foregoing description is to be viewed as being applicable to a BTS unit (or similar) when implementing the inventive concepts of the present invention. A skilled artisan would understand that minor modifications would be required, for example increased processing requirements to handle multiple signals from a plurality of MS, higher output power, etc.

The MS 212 contains an antenna 302 preferably coupled to a duplex filter or circulator 304 that provides isolation between receive and transmit chains within MS 212.

The receiver chain includes receiver front-end circuitry 306 (effectively providing reception, filtering and intermediate or base-band frequency conversion). The front-end circuit 306 receives signal transmissions from its associated BTS. The front-end circuit 306 is serially coupled to a signal processing function (processor, generally realised by a DSP) 308.

The processing function 308 typically performs, inter alia, signal demodulation. In a coded digital communication system, the received signal to be transmitted is demodulated by converting a waveform, s(t), into a block of channel-coded symbols. Thus, a number of binary bits are used to represent a signal waveform of duration T seconds. T is referred to as the signalling interval. Demodulation can be performed by assigning different bit values to variations in the amplitude, the phase, or the frequency of a high-frequency (carrier) signal. The signal processing function 308 will also typically perform error correction and encryption/decryption.

Recovered information from the signal processing function 308 is serially coupled to an de-interleaving function 309, which reformats a number of frames that have been interleaved into their correct order, as known in the art.

The de-interleaved information is then passed to the Viterbi decoder function 310, where the received data is decoded. The decoded information is then passed to the cyclic decoding and re-ordering function 311 prior to providing the bit stream to the speech decoder 312 for converting into received speech signals.

As regards the transmit chain, this essentially includes a speech encoder 320, that encodes speech signals and the reverse operation of the receiver chain. This includes cyclic encoding the encoded speech signals and re-ordering in encoding and re-ordering function 331. The re-ordered signal is then convolutionally encoded in convolutional encoder function 330, and as described in FIGS. 5 to 7.

The various frames of the convolutionally encoded signal are then interleaved in interleaving function 329, and passed to the signal processing function 328.

The signal processing function in the transmit chain encrypts the interleaved signals, differentially encodes and modulates the signal in accordance with the GSM Gaussian minimum shift keyed modulation format.

In a coded digital communication system, the signal to be transmitted is modulated by converting a block of channel-coded symbols to a suitable waveform, s(t), of finite duration for transmission. Thus, a number of binary bits are used to select a signal waveform of duration T seconds. T is referred to as the signalling interval. Modulation can be performed by varying the amplitude, phase, or frequency of a high-frequency (carrier) signal, by the input signal of the modulator.

The processed modulated signals are then up-converted in frequency conversion circuitry 322 and amplified in power amplifier 324. The processor 308, transmitter/modulation circuitry 322 and the power amplifier 324 are operationally responsive to the controller, with an output from the power amplifier coupled to the duplex filter or circulator 304, as known in the art.

A timer 318 is operably coupled to the data processing functions 308, 309, 310, 311, 312 in the receive chain and data processing functions 328, 329, 330, 331, 332 in the transmit chain to synchronise the processing operations and accurately generate the transmit signals or recover the received data.

In different embodiments of the invention, the signal processing function 308, 328, interleaving function 329, de-interleaving function 309, convolutional encoder function 330, Viterbi decoder function 310, encoding/decoding and re-ordering function 311, 331 and speech decoder 312/speech encoder 332 may be provided within the same physical processing device or any number of separate devices. A controller 314 preferably controls the information flow and operational state of each other device.

Of course, the various components within the MS 212 can be realised in discrete or integrated component form, with an ultimate structure therefore being merely an arbitrary selection.

The inventor of the present invention has recognised that channel coding applications for telecommunications systems can be implemented in high level programming language, such as 'C', for an improved timeline, whilst still taking advantage of a single-ALU or multi-ALU parallel processing capability. Specifically, 'C' code can be written for a module such as the convolutional encoder 330 to take advantage of the improved parallel processing performance now available.

The preferred embodiment of the present invention is described with respect to an implementation using the Motorola™ SC140 StarCore family of DSPs. Further details can be found in SC140 DSP Core Reference Manual, at http://www.starcore-dsp.com.

Figure 4:
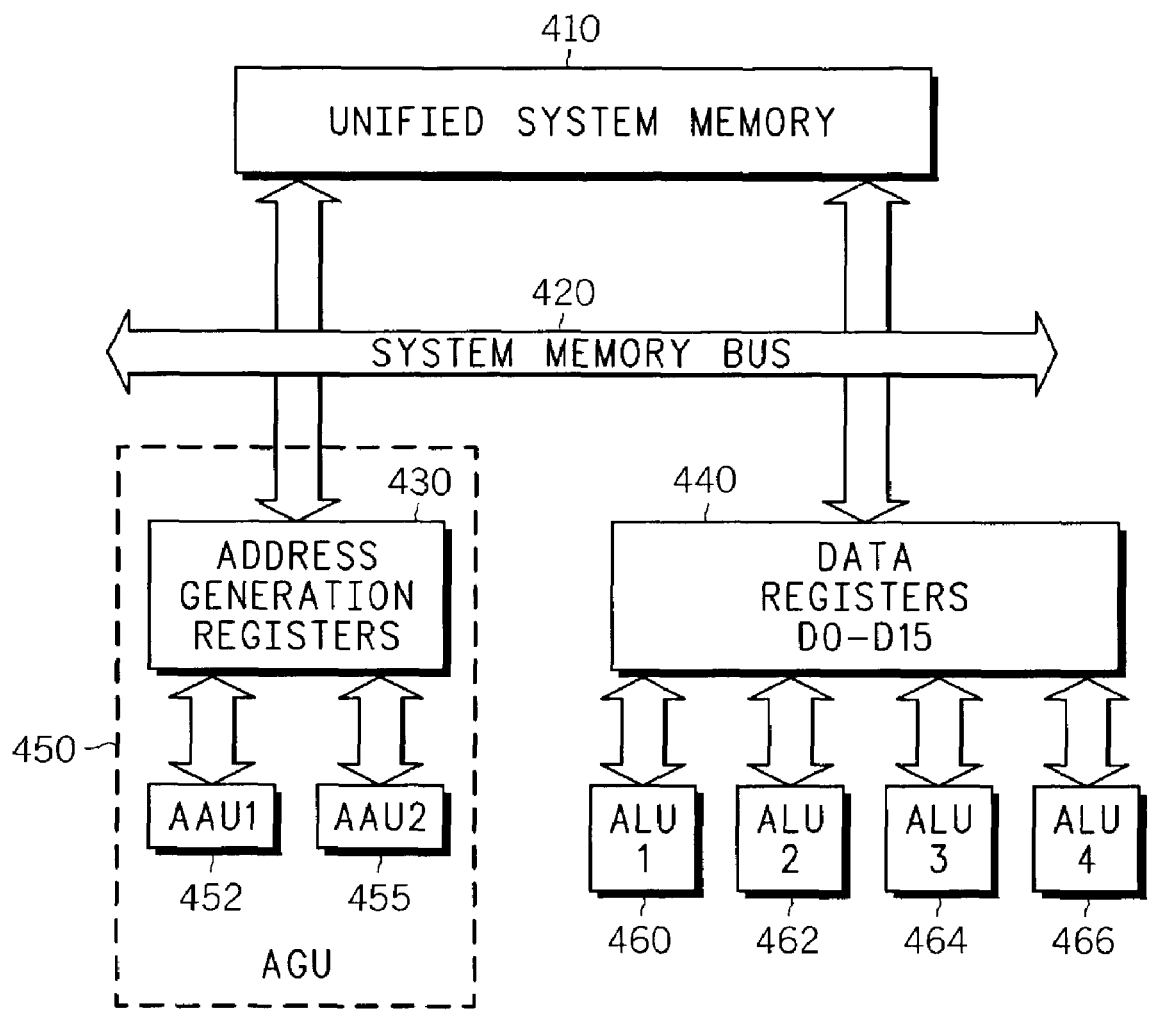
FIG. 4 shows a simplified overview of the Motorola™ SC140, configured to implement the inventive concepts in accordance with the preferred embodiment of the present invention.

A simplified overview of the SC140 configuration is shown in FIG. 4. The SC140 core 400 comprises a unified system memory 410 operably coupled to a memory bus 420 and two sets of registers: address generation registers 430 and data registers D0-D15 440. The address generation registers 430 preferably comprise an address generation unit 450, which includes one or more arithmetic address units (AAU) 452, 455. The data registers contain four arithmetic logic units (ALUs) 460, 462, 464, 466.

With this configuration, the core is able to execute up to six different and independent instructions per cycle: one in each of the four ALUs 460, 462, 464, 466 and two in the AAUs 452, 454. The bus structure 420 allows the core to transfer up to eight data words to the computational units in a single cycle.

Clearly, a skilled artisan would appreciate that the particular configuration described here is applicable to the preferred StarCore SC140 arrangement, and that different numbers of independent instructions could be configured for other DSPs.

The flexible architecture of a device such as the StarCore SC140 permits many different strategies for completing the large number of calculations required to efficiently map the convolutional encoder onto the parallel processing resources available using, for example, 'C' programming.

An intuitive way of coding the GSM/EDGE convolutional encoder in software is shown below in Table 1, with the convolutional encoder outputs obtained from the following equations:

TABLE 1 for each input x(k)
    output y(3k) = x(k) ⊕ x(k − 2) ⊕ x(k − 3) ⊕ x(k − 5) ⊕ x(k − 6)    [4]
    output y(3k+1) = x(k) ⊕ x(k − 1) ⊕ x(k − 2) ⊕ x(k − 3) ⊕ x(k − 6)    [5]
    output y(3k+2) = x(k) ⊕ x(k − 1) ⊕ x(k − 4) ⊕ x(k − 6)    [6]
end Notably, the seven input data bits (x(k) to x(k-6)) can be considered as being shifted along by one bit at a time with each pass through the loop. Three results are then calculated, in turn, and output per loop.

Figure 5:
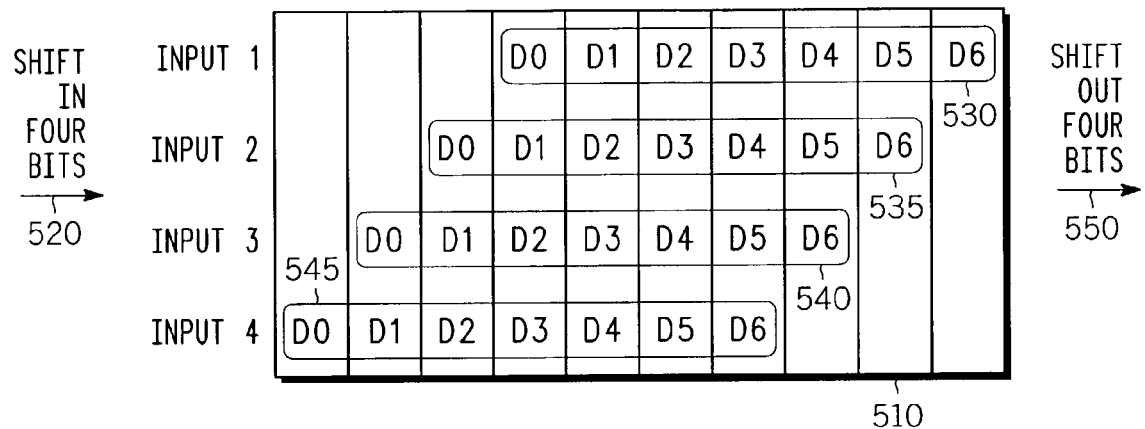
FIG. 5 shows a simplified overview of the parallel processing structure of the convolutional encoder, in accordance with the preferred embodiment of the present invention.

Referring now to FIG. 5, a simplified overview 500 of the parallel processing structure of the convolutional encoder, of the preferred embodiment of the present invention, is shown. In particular, a shift register 510 is configured as a set of independent variables, where each bit of the register is declared as a one-word variable. The register 510 is configured such that it contains more than the usual number of input bits, as shown in FIG. 5.

The register is arranged, or selected, to be longer than the constraint length 'K'. The total length of the register is thus 'K+a' bits, where each bit is stored in an independent word of memory.

Setting up a register in this manner means that a relatively large number of input bits can be read from memory only once, thus avoiding many independent moves of operands to, and from, memory. On some architectures and for some values of 'a' this in fact allows 'a+1' new inputs bits to be moved into the register in a single cycle. Since the register is longer than the constraint length, the register also needs only to be shifted once for every 'a+1' input bits, rather than once for each bit.

In prior art configurations, '1/r' bits are output per loop. In the example used here, in the preferred embodiment, 1/r=3. Using this new method of convolutional encoding '(a+1)/r' output bits can be calculated per loop due to the increased availability of input data. In this example (a+1)=4, so twelve bits can be output per loop using the new method as opposed to the previous three bits of prior art configurations.

Figure 1:
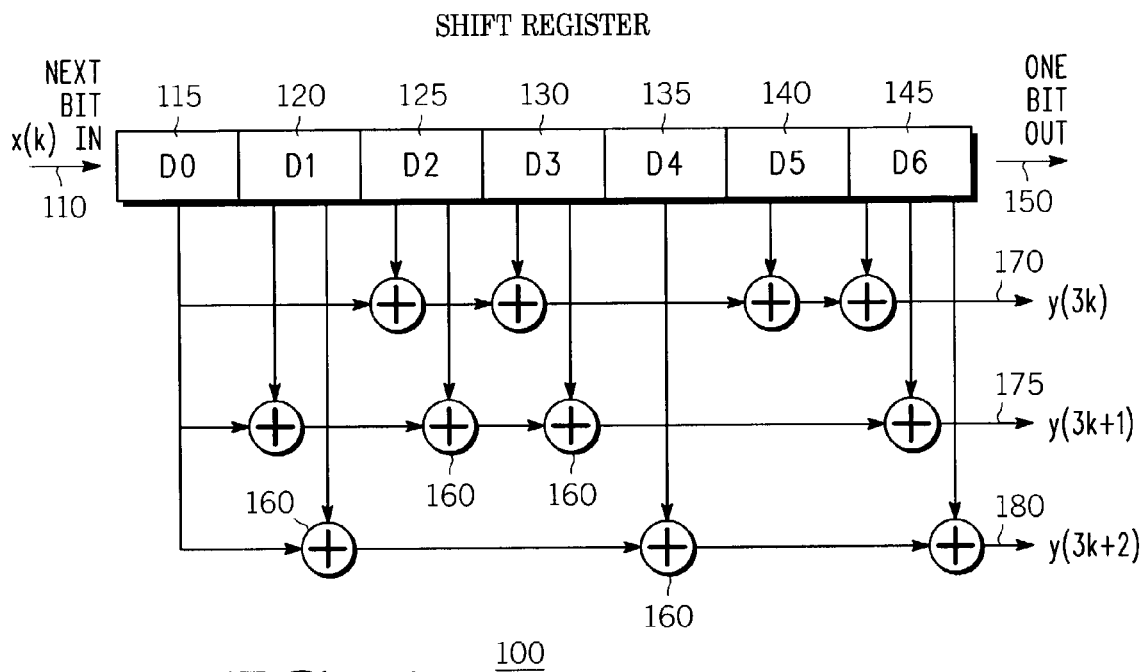
FIG. 1 shows a known convolutional encoder represented as a shift register.
Figure 3:
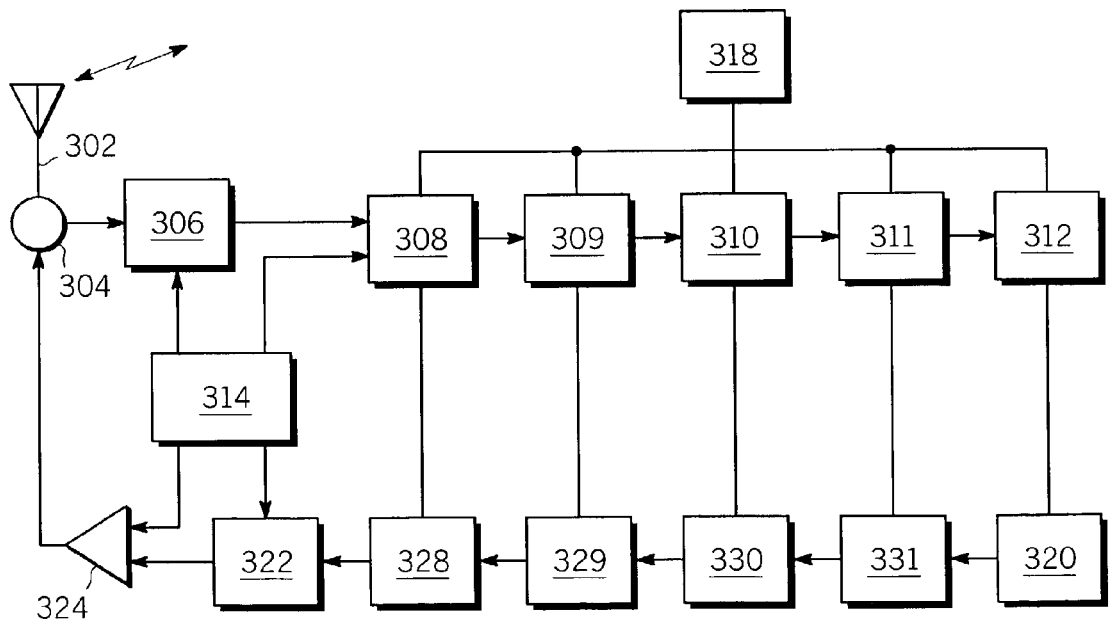
FIG. 3 shows a block diagram of a subscriber unit adapted to support the inventive concepts of the preferred embodiments of the present invention.

FIG. 5 shows the configuration of the shift register, relative to the input bits being processed, in relation to a GSM/EDGE convolutional encoder. As shown in FIG. 1, K=7, for a GSM/EDGE convolutional encoder. However, the new configuration ensures that the shift register has length 'K+a=10', with 'a+1'=four bits 520 are shifted in and four bits 550 are shifted out in each cycle. This arrangement means for example that D2⊕D3 for Input-1 530 is calculated using register elements Reg5 and Reg6, whilst for Input-4 545 D2⊕D3 is calculated using register elements Reg2 and Reg3.

Next, an efficient method of calculating the '(a+1)*r' required output bits 550 from the input bits 520 available in the register is derived. In the GSM/EDGE preferred embodiment 'a=3' and 'r=3'. Hence, twelve outputs can be calculated in each cycle.

One approach would be to calculate each output in turn, per set of loop calculations, as in the pseudo code example given above in equations [4] to [6]. However, the inventor of the present invention has recognised that this approach does not provide the best performance, as this in fact contains many redundant calculations.

For example, the term D0⊕D6 appears three times, whilst the terms ((D0⊕D6)⊕D1) and (D2⊕D3) appear twice. If written in the intuitive manner described in equations [4] to [6], these terms would be calculated repeatedly.

Figure 6:
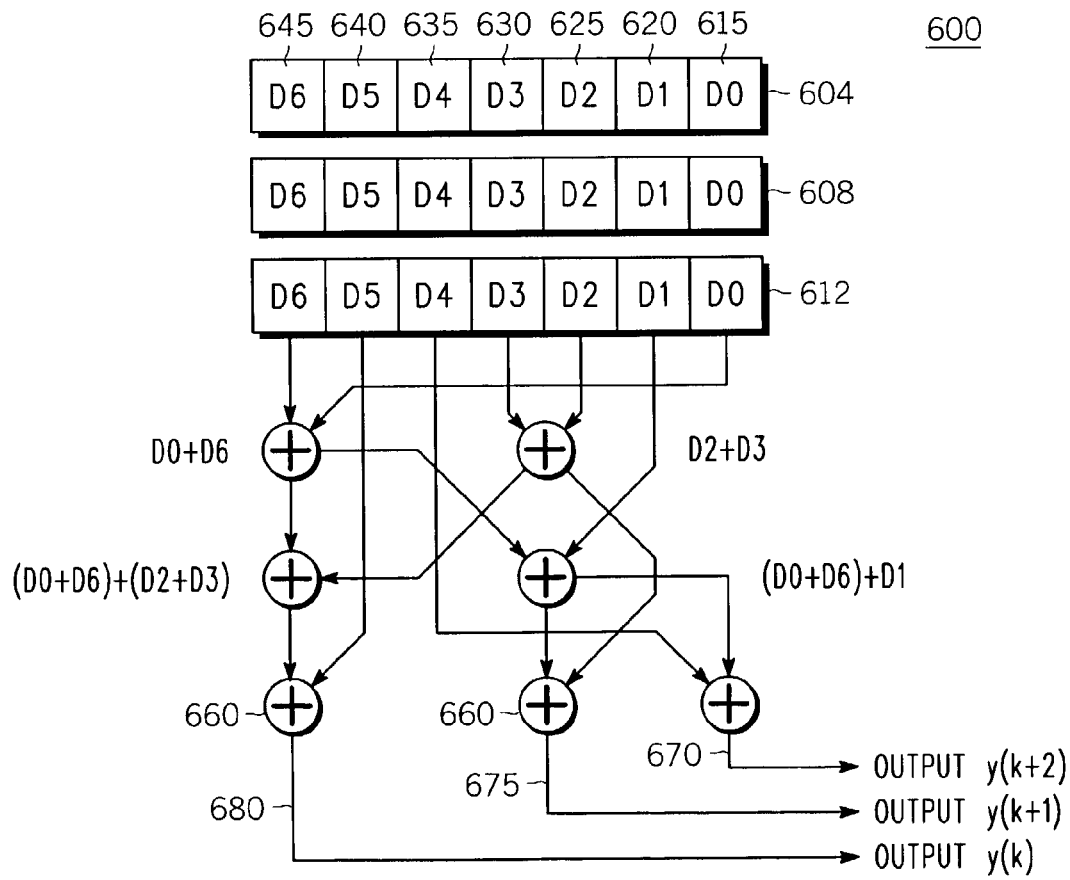
FIG. 6 illustrates how common intermediate results are calculated and then shared across multiple outputs of the convolutional encoder, in accordance with the preferred embodiment of the present invention.

Hence, an improved arrangement is illustrated with respect to FIG. 6, where common intermediate results are shared across each set of 'K' input bits 604, 608, 612 for each set of 'r' outputs 615, 620, 625, 630, 635, 640, 645.

Advantageously, the aforementioned terms are calculated only once per input bit. Furthermore, the innermost brackets are calculated first before working outwards.

In summary:
(a) (D0⊕D6) and (D2⊕D3) are calculated first, followed by;
(b) ((D0⊕D6)⊕(D2⊕D3)) and ((D0⊕D6)⊕D1), and finally;
(c) (((D0⊕D6)⊕(D2⊕D3))⊕D5), (((D0⊕D6)⊕D1)⊕(D2⊕D3)) and (((D0⊕D6)⊕D1)⊕D4), which are then sent to an output buffer.

Finally, calculations for the other input bits are introduced. As more data is available in the register at any particular time, parallel calculations can be performed for multiple sets of inputs before extracting more input data from memory. In the above example, (D0⊕D6) and (D2⊕D3) can be calculated for all four sets of input bits together in stage (a), followed by the second stage (b) of calculations, and finally the third stage (c), before writing the final results to the three output ports 670, 675, 680.

The final step is to shift the input data along by 'a+1' bits and read in new values. Advantageously, in the preferred configuration shown in FIG. 5 and FIG. 6, the data is shifted by four bits and four new values are read in parallel.

Although the preferred embodiment of the present invention is described with respect to movement of four bits in parallel, it would be appreciated that the parallel movement and processing of any number of bits greater than one would benefit from the inventive concepts described herein.

In summary, the preferred implementation requires fewer calculations, for example only seven modulo-two addition (or exclusive-or) operations as compared to eleven in the prior art configuration of FIG. 1. Hence, a substantial improvement in processing power and processing time can be achieved by implementing the more efficient calculations of the preferred embodiment of the present invention.

Figure 7:
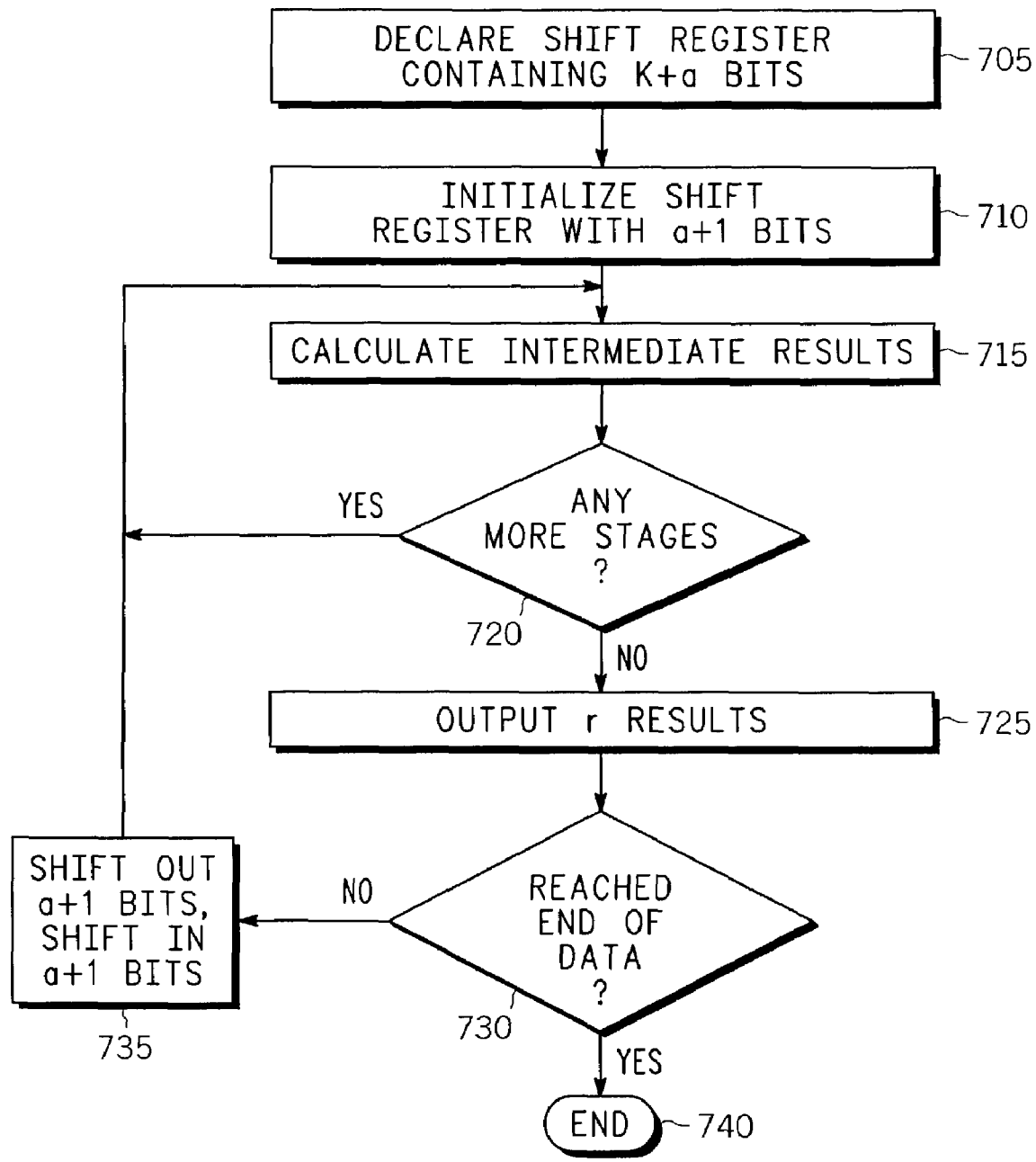
FIG. 7 shows a flowchart illustrating an efficient convolutional encoding method, in accordance with a preferred embodiment of the present invention.

Referring now to FIG. 7, a flowchart 700 illustrates the efficient convolutional encoding method, according to the preferred embodiment of the present invention. A shift register is accessed that contains 'K+a' bits, as shown in step 705. This shift register is then initialised with 'a+1' bits, as in step 710.

Intermediate calculations are then performed, as described above with respect to FIG. 5 and FIG. 6, as shown in step 715. If more stages of calculations are required (dependent upon the configuration of the particular convolutional encoder), then further intermediate calculations are made, as shown in step 720.

When all intermediate calculations have been performed in step 720, the results are output, as shown in step 725. If more data is provided to the shift register, in step 730, then the 'a+1' bits are shifted out, and a new block of 'a+1' bits shifted in. The intermediate calculations on the new shifted-in bits are then performed, following steps 715 to 730. If the end of the data is reached, the convolutional encoding process is complete, as shown in step 740.

Although the inventive concept of the present invention has been described with regard to shifting four bits, it is within the contemplation of the invention that other convolutional encoders may use any other number of input words. Shifting by '4' bits at a time allows '4' new inputs words (bits) to be moved into the register in one cycle per loop.

As shown, many of the modulo-two addition or XOR calculations are independent and can thus be calculated in parallel. Advantageously, intermediate results are immediately available in the data registers without any memory accesses as they are calculated and then immediately used. Only the final results are output to memory. The final step is to shift the variables along by '4' bits and read in '4' new values, as shown in step 735. Aligning the input data on a '4'-word boundary (where x='a+1') allows this to happen in one cycle.

The hereinbefore described implementation enables the compiler to map the 'C' code onto the DSP core. The compiler will convert the portable 'C' code into lower level assembly instructions, specific to the DSP device being used. This involves tasks such as allocating space in memory 410 for variables, scheduling movement of variables between memory 410 and registers 430 and 440 (typically done using assembly "move" instructions), and converting calculations in 'C' into machine specific assembly instructions to be performed in the calculation units 452, 455, 460, 462, 464 and 466.

The exact way the 'C' code is mapped will vary depending on the particular convolutional encoding scheme being used. However, the code is preferably written such that the compiler can provide the mapping in the same manner whenever possible, irrespective of the type of convolutional code to be generated.

An example of 'C' code that implements the aforementioned preferred embodiment is shown in FIG. 8*a* and FIG. 8*b*. There are ten variables Reg0-Reg9, according to FIG. 5, with each of these variables containing one bit of the shift register. The register is loaded with the first four input data bits, with 'previous' bits set to zero. The compiler allocates space for these variables in memory and then assigns each of these variables to one of the data registers (D0-D15) in the SC140 of FIG. 4, where they can be accessed by the ALUs.

Each time the process repeats in the main loop of step 715 to step 735 of FIG. 7, four new bits are read into Reg0-Reg3. In practice this will be performed by assembly "move" instructions transferring data from memory into appropriate registers within D0-D15 (that contain the values of Reg0-Reg9). Before this happens, other register variables are assigned the values in the register four "bits" along, for example Reg9=Reg5. This is implemented using "tfr" instructions, for example "tfr d5,d9" will transfer the value of D5 to D9.

The StarCore preferably uses a multi-word move to read the four new bits from memory into data registers D0-D3 (i.e. Reg0-Reg3) in one cycle.

Note that the compiler will decide which data registers will be used for which 'bits' and that they need not necessarily be mapped in any particular order.

Intermediate results are declared as separate independent short integers, namely "input1_temp1", "input1_temp2" etc. in this example. Each of the intermediate results is also allocated to one of the data registers D0-D15 of FIG. 4. These results are temporary, and the compiler may choose to overwrite them with results from one of the subsequent stages as soon as they are no longer needed.

With all the required data in the data registers, the compiler then allocates up to four assembly XORs per cycle, one per ALU. Values are read from the registers D0-D15 into the ALUs. The calculations are performed, and the results are stored in either the same or a different register D0-D15. Each of the final results will end up in one of the data registers before being moved to a buffer (not shown) in memory. The compiler preferably returns these to memory using assembly "move" instructions.

The use of the data registers in the aforementioned manner is dynamic. Intermediate results (stored in D0-D15) may be calculated, used in the next stage or stages, then over-written, and then perhaps overwritten again with the final results. These may then be sent from D0-D15 to memory and the same data registers re-used for storing other results immediately.

All transfers between memory and data registers are controlled by the AGU 450 and arithmetic address registers 452, 455 of FIG. 4. The arithmetic address registers contain pointers to appropriate data in memory, offsets, etc. These are typically used as operands by assembly "move" instructions operating on the data.

The compiler must take the 'C' code and decide how best to schedule instructions, store data and compute results using the available resources on the device. However, the programmer should use knowledge of the device, compiler and convolutional encoding scheme to choose intermediate terms and order the code carefully such that the compiler may make maximum use of the resources available.

It will be understood that the efficient convolutional encoder implementation described above provides the following advantages:

(i) Setting up a register (of individual bits stored in words), which is longer than the constraint length, means that a relatively large number of input bits can be read from memory only once, thus avoiding many independent moves of operands to and from memory.

(ii) Since the register is longer than the constraint length, the register need only be shifted once for every a+1 input bits, rather than once for each bit.

(iii) Calculating intermediate results for each set of K input bits and sharing these across each set of r outputs reduces the number of XOR operations required.

(iv) When implemented on a StarCore SC140 device, the configuration described above provided excellent results. Shifting by four bits at a time allows four new inputs words (bits) to be moved into the register in one cycle per loop.

Whilst specific, and preferred, implementations of the present invention are described above, it is clear that one skilled in the art could readily apply variations and modifications of such inventive concepts.

The invention claimed is:

1. A method of convolutionally encoding a data stream comprising:
   inputting a first block of two or more bits in parallel into a first portion of a plurality of data registers arranged to operate as a shift register;
   performing a number of first intermediate calculations in parallel using a number of outputs from the plurality of data registers;
   storing a number of first intermediate calculations in a second portion of the plurality of data registers; and
   using one or more of said stored number of first intermediate calculations with data stored in the first portion of the plurality of data registers to perform second intermediate calculations to be stored in the plurality of data registers; and
   calculating a final convolutionally encoded output from the plurality of data registers.

2. The method of convolutionally encoding a data stream according to claim 1, the method further comprising:
   inputting a second block of two or more bits in parallel of said data stream into said plurality of data registers arranged to operate as a shift register, when said first or second intermediate calculations have been performed; and
   performing further intermediate calculations on a number of respective outputs from the plurality of data registers.

3. The method of convolutionally encoding a data stream according to claim 2, wherein the step of inputting a second block includes the steps of:
   shifting register bit values by two or more bits per cycle; and
   reading two or more new input bits into the plurality of data registers arranged to operate as a shift register.

4. The method of convolutionally encoding a data stream according to claim 1, the method further comprising:
   configuring or selecting a portion of a plurality of data registers arranged to operate as a shift register such that said two or more bits input in parallel is longer than a constraint length of the convolutionally encoded sequence to be output.

5. The method of convolutionally encoding a data stream according to claim 1, the method further comprising:
   inputting said two or more bits into said first portion of a plurality of data registers arranged to operate as a shift register as individual words.

6. A convolutional encoder adapted to perform the method steps of claim 1.

7. A communication unit adapted to perform the convolutional encoding method steps of claim 1.

8. A communication system adapted to facilitate the convolutional encoding method steps of claim 1.

9. A convolutional encoder for convolutionally encoding a data stream the convolutional encoder comprising:
   one or more input pods;
   a plurality of data registers arranged to operate as a shift register operably coupled to said one or more input ports for receiving into a first portion of the plurality of data registers a first block of two or more bits in parallel of said data stream;
   calculation means, operably coupled to said plurality of data registers arranged to operate as a shift register to perform logical calculations on outputs from said plurality of data registers; and
   one or more output ports, operably coupled to said calculation means, to output a convolutionally encoded data stream;
   wherein said
   calculation means is arranged to perform a number of first intermediate calculations in parallel using a number of outputs from the plurality of data registers;
   a second portion of said plurality of data registers is arranged to store a number of first intermediate calculations; and
   said calculation means is arranged to re-use one or more of said stored number of first intermediate calculations with data stored in the first portion of a plurality of data registers to perform second intermediate calculations to be stored in the plurality of data registers and generate a final convolutionally encoded output from the plurality of data registers.

10. The convolutional encoder according to claim 9, comprising said calculation means performing said intermediate calculations in a series of pre-determined stages.

11. The convolutional encoder according to claim 9, further comprising said plurality of data registers receiving a second block of two or more bits of said data stream in parallel when intermediate calculations have been performed and said calculation means is arranged to perform further intermediate calculations using said second block of two or more bits and a number of outputs from the plurality of data registers.

12. The convolutional encoder according to claim 9, further comprising said second block of bits being input to said plurality of data registers by shifting register bit values by said two or more bits per cycle; followed by inputting two or more new input bits from said data stream into said plurality of data registers.

13. The convolutional encoder according to claim 9, further comprising said two or more bits input in parallel being longer than a constraint length of the convolutionally encoded sequence to be output.

14. The convolutional encoder according to claim 9, further comprising said plurality of data registers receiving said two or more bits in parallel as individual words.

15. A communication unit comprising the convolutional encoder of claim 9.

16. A communication system comprising the communication unit of claim 15.

* * * * *